(12) United States Patent
Hirota et al.

(10) Patent No.: US 6,248,625 B1
(45) Date of Patent: Jun. 19, 2001

(54) MANUFACTURING METHOD OF CYLINDRICAL-CAPACITOR LOWER ELECTRODE

(75) Inventors: Toshiyuki Hirota; Kazuhiro Takeda, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/558,802

(22) Filed: Apr. 26, 2000

(30) Foreign Application Priority Data

May 7, 1999 (JP) .................................................. 11-127367

(51) Int. Cl.⁷ ................................................ H01L 21/8242
(52) U.S. Cl. ......................... 438/253; 438/396; 438/255
(58) Field of Search ................................... 438/238–242, 438/250–256, 381, 393–399

(56) References Cited

U.S. PATENT DOCUMENTS 5,346,844 * 9/1994 Cho et al. .
5,940,713 * 8/1999 Green ................................. 438/396

FOREIGN PATENT DOCUMENTS

| 5-63152 | 3/1993 | (JP) . |
| 6-85171 | 3/1994 | (JP) . |
| 9-107080 | 4/1997 | (JP) . |
| 9-237878 | 9/1997 | (JP) . |
| 9-331043 | 12/1997 | (JP) . |

* cited by examiner

Primary Examiner—Jey Tsai

(57) ABSTRACT

There is presented a method of manufacturing a cylindrical capacitor, which has the steps of forming a conductive film over the entire surface of a semiconductor substrate which includes a hole that is to function as a mould of a cylindrical-capacitor lower electrode, without changing the form of the hole; and coating thick the entire surface of the semiconductor substrate with photoresist so as to fill up said hole; wherein the exposure is made in such a way that the oblique components of the incident light with respect to the normal to the semiconductor substrate is substantially dominant, at least, in the formation region of said lower electrode. The present invention can provide a method in which sufficient photoresist is made to remain inside of the hole for the cylindrical capacitor so as to protect a conductive film therein, while an unnecessary photoresist lying outside of the hole is thoroughly removed, and produce a cylindrical capacitor of constant good quality for a next-generation semiconductor memory device with a high throughput.

10 Claims, 9 Drawing Sheets

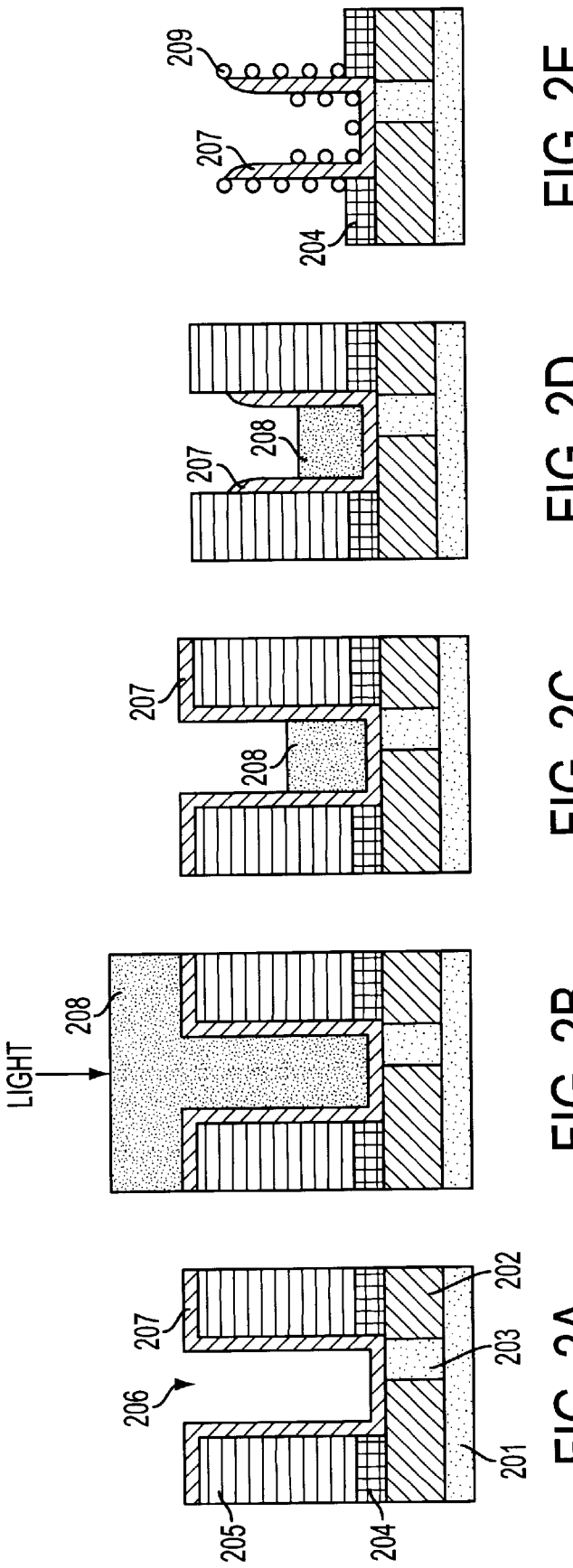

MANUFACTURING METHOD OF CYLINDRICAL-CAPACITOR LOWER ELECTRODE

BACKGROUND OF THE INVENTION

1. Field of the Invention

The present invention relates to a manufacturing method of a semiconductor device and more particularly to a manufacturing method of a cylindrical-capacitor lower electrode for use in semiconductor device.

2. Description of the Related Art

The use of a cylindrical capacitor has been proposed from a necessity to form a capacitor with a required capacitance in a given occupation area that has become very limited, accompanying the reduction of the cell size in a Dynamic Random Access Memory (referred to as DRAM, hereinafter). The cylindrical capacitor has been formed, to date, as follows.

FIG. 2 is a series of cross-sectional views illustrating, in sequence, the steps of a manufacturing method of a cylindrical capacitor according to a first conventional method.

Upon a semiconductor substrate 201, an interlayer insulating film 202 and an etching stopper 204 are formed, and therethrough a conductor plug 203 is formed so as to provide electrical connection with the semiconductor substrate 201, and then a spacer insulating film 205 is formed over the entire surface of the wafer by a known technique of CVD (Chemical Vapour Deposition). Further, by known techniques of photolithography and etching, a hole 206 for a cylindrical capacitor that is to function as a mould of a cylindrical-capacitor lower electrode is formed, and amorphous silicon 207 of which a cylindrical-capacitor lower electrode is to be made in the later step is formed over the entire surface including the internal wall and the bottom of the hole 206 for the cylindrical capacitor (FIG. 2-(a)).

Next, in order to remove the superfluous conductive film other than the one to become the cylindrical-capacitor lower electrode, a coating of an appropriate protective material 208 for etching is applied thick over the entire surface of the wafer so as to fill up the hole 206 for the cylindrical capacitor (FIG. 2-(b)).

Regarding the protective material 208 for etching that can protect the conductive film placed inside of the hole for the cylindrical capacitor when plasma etching of the superfluous part of the conductive film is carried out, there have been examined several materials capable to secure a sufficient etching selection ratio to the conductive film, for example, materials based on silicon oxide film (the organic SOG (Spin-On-Glass), the inorganic SOG, the CVD oxide film and the like, which have excellent filling characteristics) and the photoresists. Among them, the method utilizing the photoresist has attracted the most attention as a method that can be readily realized with a relatively low cost.

Next, carrying out the development, the exposed portion of the photoresist 208 is removed (FIG. 2-(c)).

Next, by means of plasma etching, the superfluous portion of amorphous silicon 207 lying on the wafer surface is removed (FIG. 2-(d)).

Finally, etching is performed over the entire surface by a known method, and thereby a spacer insulating film 205 is removed (FIG. 2-(e)).

In the present example, silicon grains 209 are further formed on the internal and external walls of the cylindrical-capacitor lower electrode, using the hemispherical grain (referred to as HSG, hereinafter) technique.

In the manufacturing method of a cylindrical capacitor, it has become one of the most important things to achieve that the photoresist placed inside of the hole for the cylindrical capacitor is left as much as possible, while the photoresist lying outside of the hole for the cylindrical capacitor is thoroughly removed. The explanation lies in the fact that the positive photoresist remained on the wafer surface may act as a mask and cause unnecessary parts of the conductive film to be left behind when the conductive film is etched, resulting in short-circuit between cylindrical-capacitor lower electrodes and, thus, a lowering of a yield in production. On the other hand, in the case that the amount of the photoresist remaining inside of the hole for the cylindrical capacitor is too small, the part of the conductive film lying on the internal wall of the hole for the cylindrical hole may also receive damage from plasma in the next step of plasma etching over the conductive film.

In order to remove the photoresist lying outside of the hole for the cylindrical capacitor thoroughly, there has been hitherto employed a method in which the dose of exposure is somewhat set at a level of over-exposure at the time of all surface exposure so that the unnecessary part of the photoresist lying on the wafer surface are completely sensitized. The conventional positive photoresist is, however, designed in such a way that the amount of remaining photoresist film after development is rapidly reduced (sensitized), once the dose of exposure exceeds a certain level. This makes suitable control of the dose of exposure difficult. Consequently, when over-exposed, the amount of remaining photoresist film enough to protect the conductive film placed inside of the hole for the cylindrical capacitor may not be secured and there have been occasions when parts of the conductive film lying on the internal wall and the bottom of the hole for the cylindrical capacitor have been also etched at the time of plasma etching over the conductive film.

To solve this problem, a second conventional method is disclosed in Japanese Patent Application Laid-open No.331043/1997. In this method, by lowering the sensitivity of the positive photoresist, the slope of the sensitivity profile showing the relationship between the amount of the remaining photoresist film and the dose of exposure ((the amount of change in film thickness of the photoresist)/(the amount of change in dose of exposure)=γ) is made gentler and the control of the dose of exposure, easier.

The second conventional method is very effective as long as it is used for the purpose of protecting the bottom of the hole for the cylindrical capacitor in plasma etching of the conductive film. However, regarding cost, it is disadvantageous, because the use of the photoresist with a lowered sensitivity requires an additional adjustment for the photoresist used solely in this step.

Further, in order to attain precise control of the dose of exposure in the second conventional method, the photoresist sensitivity must be sufficiently lowered and the exposure time must be set considerably long, which is another drawback in point of throughput.

Moreover, the phenomenon in which, with the normal incidence, the incident light penetrates to the bottom of the hole for the cylindrical capacitor and makes the photoresist recede has not been essentially overcome yet.

In both methods of the first conventional method and the second conventional method, the part of the conductive film which becomes uncovered and shows up above the photoresist, due to the over-exposure, gives rise to several problems in the later steps.

First of all, the part of the internal wall of the hole for the cylindrical capacitor showing above the photoresist is directly exposed to plasma, in plasma etching of the conductive film, and, as a result, the upper end of the hole for the cylindrical capacitor becomes tapered (FIG. 2-(e)). It was found that, because this section is very thin and mechanically fragile, it is easily damaged and broken into particles in the later step of cleaning or the like. In addition, because of its sharply pointed form, a lowering of reliability due to the electric field centralization is very much concerned.

The problem that the conductive film of the upper end of the hole for the cylindrical capacitor takes the shape of a taper becomes very marked when the initial film thickness of the conductive film that is to become the cylindrical-capacitor lower electrode is 80 nm or less.

Meanwhile, one of the techniques to increase the surface area which has come into wide use in recent years is the HSG technique. In this technique, in the region of the transition temperature between amorphous and crystal, amorphous silicon is annealed either in an inert atmosphere or in a high vacuum, and, through the use of the surface migration of silicon atoms, hemispherical or mushroom-shaped grains are formed, with crystal nuclei which have been formed on the surface thereof acting as cores. This technique has attracted much attention in recent years as a method to enlarge the surface area of the electrode.

When an attempt to combine a conventional manufacturing method of a cylindrical capacitor and the HSG technique is made, however, the present inventors discovered that the HSG becomes difficult to be formed on the surface of amorphous silicon, once amorphous silicon is exposed to plasma in plasma etching of the conductive film.

This was found to result from the penetration (knock-on) that the energized dopant ions in plasma makes into the surface of amorphous silicon by a depth of several nim or so, because it inhibits the surface migration of silicon atoms in annealing. The HSG technique is one of the most important techniques in fabrication of the next-generation semiconductor memory device, being effective to increase the capacitance of the capacitor. Therefore, it is considered a great disadvantage in manufacturing the semiconductor memory device with the forthcoming integration degree that the HSG technique cannot be applied to the surface of the capacitor lower electrode.

SUMMARY OF THE INVENTION

In forming a cylindrical-capacitor lower electrode within a semiconductor memory device, the conventional methods, to date, are incapable to leave enough photoresist inside of a hole for a cylindrical capacitor to protect a conductive film therein, because the exposure is carried out using the normal incident light, and this causes various problems in the later steps. In light of this, an object of the present invention is to provide a method in which sufficient photoresist is made to remain inside of the hole for the cylindrical capacitor so as to protect a conductive film therein, while an unnecessary part of the photoresist lying outside of the hole is thoroughly removed, and to produce a cylindrical capacitor of constant good quality for a next-generation semiconductor memory device with a high throughput.

The present invention provides a method of manufacturing a cylindrical-capacitor lower electrode for use in semiconductor device; which comprises the steps of:

forming an interlayer insulating film on a semiconductor substrate where semiconductor elements are formed;

opening a recess section that is to function as a mould of a cylindrical-capacitor lower electrode in a prescribed region of said interlayer insulating film;

forming a conductive film over said interlayer insulating film which includes an internal wall of said recess section, without changing the recess form;

coating thick said conductive film with a positive photoresist so as to fill up said recess section;

exposing said photoresist lying on said conductive film to light, while leaving said photoresist inside of said recess section;

developing in which said photoresist lying on said conductive film is selectively removed, while leaving said photoresist inside of said recess section;

performing etch-back in which said conductive film lying on said interlayer insulating film is selectively removed by means of etching, while leaving said conductive film inside of said recess section; and peeling in which said photoresist inside of said recess section is removed; wherein:

in said step of exposure, exposure is made in such a way that the oblique components of the incident light, with respect to the direction normal to the semiconductor substrate is substantially dominant, at least, in the formation region of said lower electrode.

Regarding the exposure light used in said step of exposure, it is preferable that rays whose incident angles with respect to the direction normal to the semiconductor substrate are within 10° do not exceed 50% of the whole incident light on the wafer. Further, it is more preferable that rays whose incident angles with respect to the direction normal to the semiconductor substrate are within 10° do not exceed 30% of the whole incident light on the wafer. Further, in said step of exposure, the incident light employed for exposure may be oblique one that is composed of rays whose incident angles with respect to the direction normal to the semiconductor substrate are not less than 10°.

By carrying out the exposure over the hole for the cylindrical capacitor according to the method described above, it becomes possible to leave a sufficient amount of the photoresist inside of the hole and to protect a metal film for the cylindrical-capacitor lower electrode well.

In the step of exposure, various mechanisms can be utilized.

For example, in said step of exposure, exposure can be made by a mechanism in which the semiconductor substrate is scanned with the incident light in the direction of a straight line and, synchronized with that, the wafer is moved perpendicular to said scanning direction of the incident light in the plane where the semiconductor substrate is included.

Further, exposure can be collectively applied to all semiconductor elements present on the semiconductor substrate by a parallel beam. Further, when a wide parallel beam is utilized for exposure, exposure can be carried out with the semiconductor substrate being rotated.

Further, it is more preferable to conduct exposure by a reduction projection exposure system. In such a case, it is preferable that the conditions for an optical system in the reduction projection exposure system are $NA \geq 0.5$ and $0.7 \leq \sigma \leq 1$. Further, in the case that a reduction projection exposure system is utilized for exposure, it is more preferable that a filter to limit the incident angles of the incident light is additionally inserted in the optical system so as to omit the components of light close to that of the normal incidence.

Here, NA is the numerical aperture of a reducing lens on the side of the wafer. $\sigma$ is the ratio of NA of a collimating lens to NA of a reducing lens on the side of a reticle, and a quantity relating to spatial frequency dependence of the optical contrast.

Further, any one of the above-mentioned manufacturing methods can be applied to a manufacturing method of a semiconductor device fittingly. The present invention provides such a manufacturing method, together with a semiconductor device manufactured using said manufacturing method.

BRIEF DESCRIPTION OF THE DRAWINGS

FIGS. 2a–2e is a series of schematic cross-sectional views, illustrating, in sequence, the steps of a conventional manufacturing method of a cylindrical-capacitor lower electrode.

FIG. 3-(b) is a graph showing the relationship between the dose of exposure and the film thickness of remaining photoresist in the first conventional method. FIG. 3-(c) is a graph showing the relationship between the dose of exposure and the film thickness of remaining photoresist in the second conventional method. FIG. 3-(d) is a graph showing the relationship between the dose of exposure and the film thickness of remaining photoresist in the present invention.

FIG. 4-(b) is a graph showing the angular distribution of the incident light in the first example.

FIG. 5-(b) is a graph showing the angular distribution of the incident light in the second example.

FIG. 6-(b) is a graph showing the angular distribution of the incident light in the third example.

FIG. 7-(b) is a graph showing the angular distribution of the incident light in the fourth example.

FIG. 8-(b) is a graph showing the angular distribution of the incident light in the fifth example.

Figure 1E:
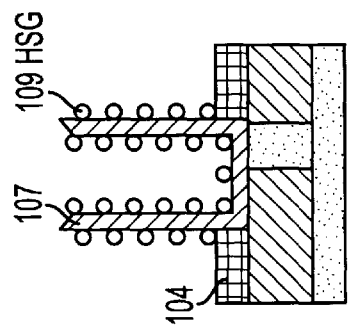
FIGS. 1a–1e is a series of schematic cross-sectional views, illustrating, in sequence, the steps of a manufacturing method of a cylindrical-capacitor lower electrode according to the present invention.
Figure 1D:
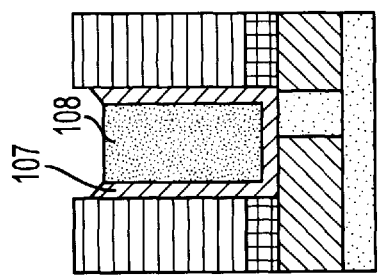
Figure 1C:
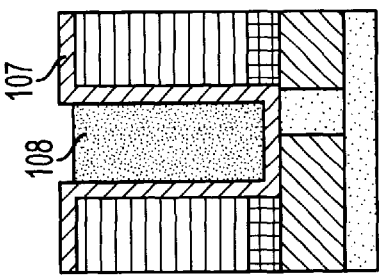
Figure 1B:
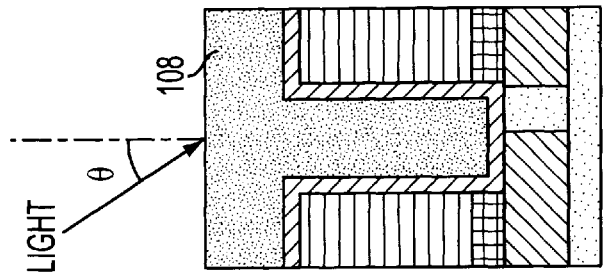
Figure 1A:
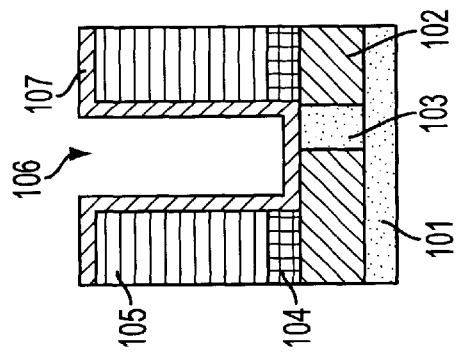
Figure 3B:
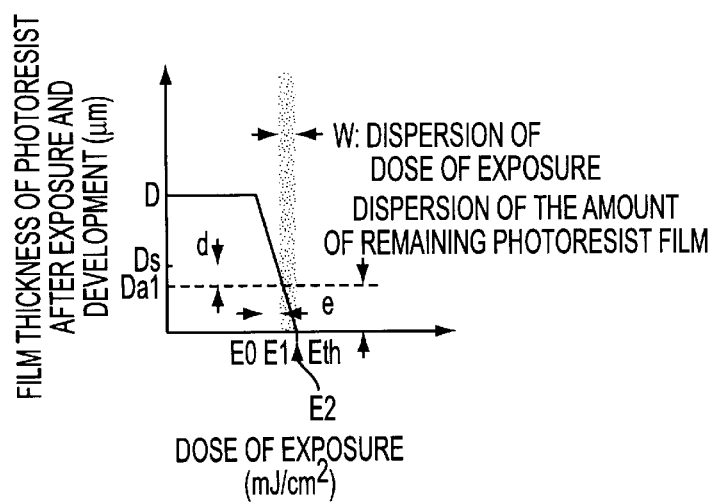
FIG. 3-(a) is a schematic cross-sectional view of a cylindrical capacitor directly before the step the step of exposure.
Figure 3A:
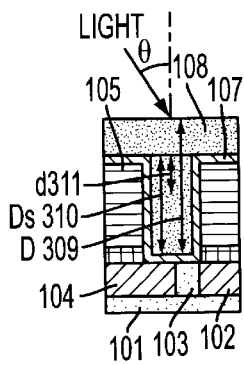
Figure 3C:
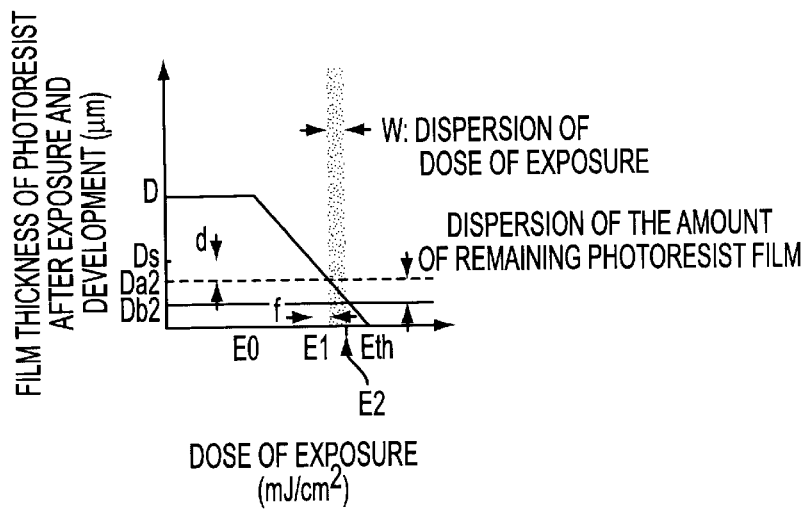
Figure 3D:
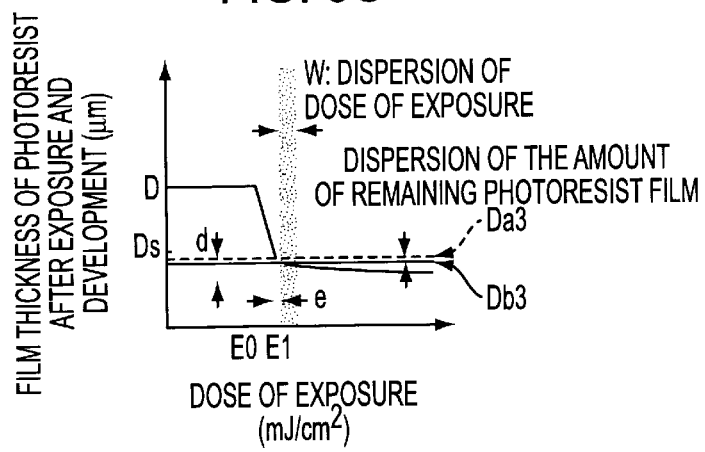

| Explanation of symbols: | |
|---|---|
| 101, 201 | Semiconductor substrate |
| 102, 202 | Interlayer insulating film |
| 103, 203 | Conductor plug |
| 104, 204 | Etching stopper |
| 105, 205 | Spacer insulating film |
| 106, 206 | Hole for cylindrical capacitor |
| 107, 207 | Conductive film (Amorphous silicon) |
| 108, 208 | Photoresist (Protective material for etching) |
| 109, 209 | HSG |
| 309 | Film thickness of photoresist |
| 310 | Depth of hole for cylindrical capacitor |
| 311 | Film thickness of portion of photoresist for over-exposure |
| 401, 502, 605, 711 | Wafer |
| 402 | Polygon mirror |
| 501, 606 | Stage |
| 601, 702 | Light source |
| 602 | Condenser lens |
| 603 | Shutter |

| -continued | |
|---|---|
| Explanation of symbols: | |
| 604, 706 | Collimating lens |
| 607 | Rotation axis |
| 701 | Reflecting mirror |
| 703 | Relay lens |
| 704 | Optical integrator |
| 705 | σ stop |
| 707 | Reticle |
| 708 | Rejection lens 1 |
| 709 | NA stop |
| 710 | Projection lens 2 |
| 812 | Pupil filter 1 |
| 813 | Pupil Filter 2 |

DETAILED DESCRIPTION OF THE PREFERRED EMBODIMENTS

In the present invention, the exposure of the photoresist is carried out using a beam of substantially oblique incidence, and thereby the protection of a metal film that is to serve as a lower electrode for a cylindrical capacitor is achieved. Because an aspect ratio of a hole for a cylindrical capacitor is 2–4, which is considerably large, the oblique incident light cannot penetrate deeper than a certain depth within the hole for the cylindrical capacitor, being obstructed by the hole for the cylindrical capacitor itself. Accordingly, the exposure of the photoresist placed inside of the hole for the cylindrical capacitor can be well avoided. The range of the incident angle of the incident light largely depends on the aspect ratio (the depth of the hole/the diameter of the hole) of the hole for the cylindrical capacitor. The aspect ratio generally employed for the hole for the cylindrical capacitor is 2–4. The present inventors experimentally established that, if the aspect ratio is equal to or more than 2, a sufficient amount of the photoresist can be left inside of the hole for the cylindrical capacitor by using either an exposure light for which only 50% or less of the whole radiation entering the wafer consists of rays whose incident angles with respect to the direction normal to the semiconductor substrate are within 10°, or an exposure light composed of rays whose incident angles with respect to the direction normal to the semiconductor substrate are not less than 10°, and, at the same time, carrying out the exposure for an appropriate duration of time.

Because the bore of the hole is small and not much different from the wavelength of the exposure light, a tilt from the normal to provide an incident angle of mere 10° or so is thought to be able to suppress the exposure of the photoresist placed inside of the hole for the cylindrical capacitor through the effects of light scattering, diffraction or the like, though its clear mechanism is not known.

The use of the exposure light composed of rays whose incident angles with respect to the direction normal to the wafer are not less than 15° is more preferable, and the use of the exposure light composed of rays whose incident angles with respect to the direction normal to the wafer are not less than 25° is the most preferable. FIG. 3-(a) is a cross-sectional view of a cylindrical capacitor directly before the step of exposure. Here, D 309 is the film thickness of the photoresist of coating the wafer, which is measured as the height of the photoresist top surface from the bottom of the hole for the cylindrical capacitor. Ds 310 is the depth of the hole for the cylindrical capacitor, and d 311 represents the film thickness of the portion of the photoresist for over-exposure, which is described below. Symbols other than these are the same as in FIG. 1.

FIG. 3-(b) is a graph showing the relationship between the dose of exposure (in horizontal axis) and the film thickness of remaining photoresist (in vertical axis) in the above-mentioned first conventional method, wherein normal incident light is used and a photoresist with an ordinary sensitivity is employed as a protective material for the hole for the cylindrical capacitor. Here, D represents the height of the photoresist of coating measured from the bottom of the cylindrical capacitor and Ds, the depth of the hole for the cylindrical capacitor, as shown in FIG. 3-(a).

Now, let E1 denote the dose of exposure able to remove only the portion of the photoresist lying on the wafer surface.

Yet, taking the dispersion of the values of photoresist film thickness into consideration, the over-exposure e as mach as to remove the portion of the photoresist corresponding to the film thickness of d is made so as to prevent the resist from remaining thereon. The dose of exposure E2 irradiating the wafer is, thus, given by the following equation:

$$E2=E1+e$$

In addition to this, if the dispersion of the dose of exposure with a width of W is considered, E2 is expressed as follows:

$$E2=E1+e+W/2\pm W/2$$

When this range of the dose of exposure is applied to FIG. 3-(b), the amount of remaining photoresist film inside of the hole is estimated in the range of 0–Da1.

In the first conventional method, this possible amount of remaining photoresist film includes 0 so that there remains a possibility that whole photoresist placed inside of the hole for the cylindrical capacitor is completely removed. Further, this infers that the heights of the conductive films showing up above the photoresist vary with holes for the cylindrical capacitors as well as with treatment lots. This sort of dispersion may contribute to bring about a reduction in yield in the later steps.

FIG. 3-(c) is a graph showing the relationship between the dose of exposure and the film thickness of remaining photoresist in the second conventional method (the method disclosed in Japanese Patent Application Laid-open No.991043/1994) wherein the photoresist with a lowered sensitivity is utilized.

The dose of exposure can be estimated in the similar manner to that of the first conventional method. However, as the sensitivity of the photoresist is low, the dose of exposure enough to expose the same portion of the photoresist for over-exposure corresponding to the film thickness of d becomes f, differing from that in the first conventional method.

Further, with the dispersion W of the dose of exposure considered in the same way as the first conventional method, the dose of exposure which the photoresist receives in the second conventional method is in the following range:

$$E2=E1+f+W/2\pm W/2$$

For such a range of the dose of exposure, the amount of remaining photoresist film is Da2–Db2 (Cf. FIG. 3-(c)) so that, even in the worst possible case, the photoresist of Db2 can remain inside of the hole for the cylindrical capacitor, which gives an advantage over the first conventional method to this method.

Nevertheless, the normal incident light being utilized, the loss of the portion of the photoresist corresponding to the film thickness of d (the portion for over-exposure) at minimum through exposure cannot be avoided.

FIG. 3-(d) illustrates the case in which exposure is carried out, utilizing an ordinary photoresist but using an oblique incident light according to the present invention.

In the same way as the first conventional method (FIG. 3-(b)) and the second conventional method (FIG. 3-(c)), the over-exposure is carried out with the object of preventing the unnecessary photoresist from remaining on the wafer surface completely. The dose of exposure for over-exposure thereat is e, the same as the first conventional method (the dose of exposure e is enough to expose the portion of the photoresist corresponding to the film thickness of d in the first conventional method). E2 is, thus, the same as the first conventional method and given by the following equation:

$$E2=E1+e+W/2\pm W/2$$

In contrast with the cases of the conventional methods, however, with the oblique incident light utilized, the incident light for the portion of the over-exposure is obstructed by the hole for the cylindrical capacitor and unable to penetrate deeper than a certain level that is determined by the incident angle θ and the bore of the hole for the cylindrical capacitor.

In FIG. 3-(d), the slope of the profile becomes gentler at E1. This indicates that the photoresist has already been exposed down to the deepest possible position for that particular incident angle. The presence of the region above E1 where the slope is gentler can be ascribed to the remaining photoresist within the hole for the cylindrical capacitor which is left in the depths where the exposure light cannot enter sufficiently any more. It is considered that the exposure of the photoresist in this part proceeds gently not by the direct light but by the indirect light such as scattered light, reflected light and the like.

As explained above, even taking over-exposure e into consideration, in the same way as the first conventional method, the photoresist high enough to protect the conductive film remains inside of the hole for the cylindrical capacitor, if an appropriate incident angle is chosen (FIG. 3-(d)). Further, any incident light entering the hole for the cylindrical capacitor is mechanically cut by the hole itself so that the dispersion of the film thickness of the remaining photoresist (Da3–Db3) is much reduced in comparison with either of the first conventional method or the second conventional method, which stabilizes the quality of the capacitor in production.

EXAMPLES

First Example

In the present example, a method of manufacturing a cylindrical-capacitor lower electrode alone is described with reference to FIG. 1. First, upon a semiconductor substrate 101 where semiconductor elements (not shown in the drawings) are formed, an interlayer insulating film 102 and a NSG (Non-doped Silica Glass) as an etching stopper 104 are formed by the CVD method, as shown in FIG. 1-(a).

Next, at a prescribed position, a contact hole is made open by known techniques of lithography and etching and, then, after dopant-containing polysilicon is grown over the entire surface of the wafer by the CVD method, etch-back is performed to form a conductor plug 103. Next, as a spacer insulating film 105, BPSG (Boro-Phospho-Silicate Glass) is grown to a thickness of approximately 1.0 μm by the CVD method and, then, using known techniques of lithography and etching, a hole to reach the conductor plug 103 is made open. Next, amorphous silicon 107 containing phosphorus as dopants is grown to a thickness of approximately 600 Å over the entire surface of the wafer including the internal wall and the bottom of the hole 106 for the cylindrical capacitor. Next, as shown in FIG. 1-(b), a coating of positive photoresist 108 is applied to a thickness of approximately 1 μm excluding the hole depth so as to fill up the hole 106 for the cylindrical capacitor and thereafter exposure is carried out. Here, the hole 106 for the cylindrical capacitor is ellipse in shape, and is 1.2 μm in depth and 0.4 μm in bore (in the direction of major axis) so that its aspect ratio is approximately 3. The incident angle of the incident beam with respect to the direction normal to the wafer surface is 45° and the dose of exposure is approximately 120 mJ/cm².

As a result of the exposure, the photoresist which remains inside of the hole with a depth of 1.2 μm has a height of 0.95 μm, showing that an excellent selectivity of exposure is obtained therein.

Figure 4A:
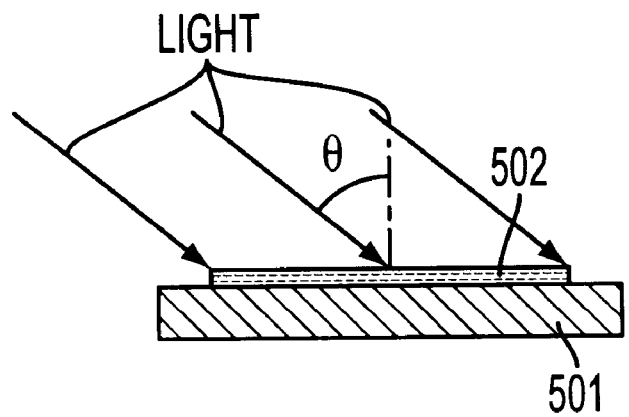
FIG. 4-(a) is a schematic view of the first example.
Figure 4B:
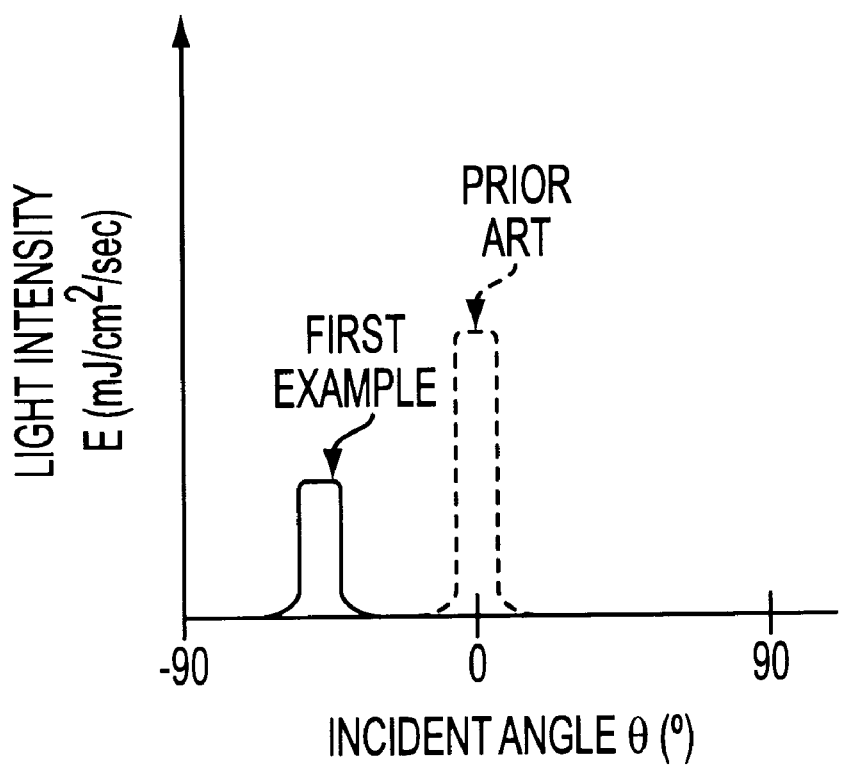

In order to irradiate the wafer by an oblique incident beam, a mechanism shown in FIG. 4-(a) is used. In short, the wafer 401 is scanned with the laser beam in the direction of the y-axis by means of a polygon mirror and, synchronized with that, the wafer 401 is moved in the direction of the x-axis, and thereby the exposure is applied to all surface of the wafer.

The angular distribution of the incident light in the present example is shown in FIG. 4-(b). The peak is at an angle corresponding to the incident angle θ.

Subsequently, as shown in FIG. 1-(d), superfluous amorphous silicon 107 lying on the entire surface of the wafer is removed by a known method of plasma etching. Next, the photoresist placed in the hole for the cylindrical capacitor is removed by heated sulfuric acid or the like, and then the spacer insulating film 105 is removed by hydrofluoric acid or the like, and, subsequently, amorphous silicon 107 is worked into shape of a sidewall.

Following that, as shown in FIG. 1-(e), by a known method, HSGs 109 are formed on the internal as well as external surfaces of cylindrically-shaped amorphous silicon 107.

Since amorphous silicon 107 that is to become a cylindrical-capacitor lower electrode is well protected from plasma by photoresist 108 in the present example, it is possible to prevent the upper end of the amorphous silicon 107 from becoming sharp in the form of a taper. On the same account, silicon HSGs 109 can be formed uniformly on the internal as well as external wall of the cylindrical-capacitor lower electrode.

In the present example, the amorphous silicon film is formed into shape of a cylinder and thereafter HSGs 109 are formed selectively. However, in the case that formation of the HSGs 109 is only required on the internal surface of the cylindrical capacitor, HSG formation may be carried out simultaneously with the formation of the amorphous silicon film, in the step of FIG. 1-(c). Further, while the cylindrical-capacitor lower electrode in the present example is made of silicon, the material for that is not limited to silicon and can be a conductive film of metal or the like, for example, TiN, WSi, ruthenium or a layered film of these.

After that, a dielectric film and an upper electrode are formed and thereby a cylindrical capacitor is accomplished (not shown in the drawings).

Second Example

Figure 5A:
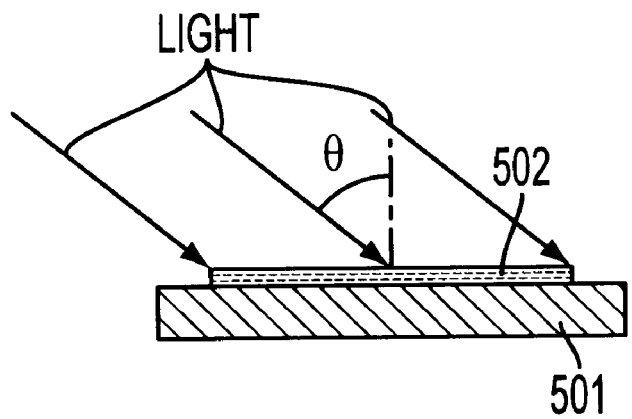
FIG. 5-(a) is a schematic view of the second example.
Figure 5B:
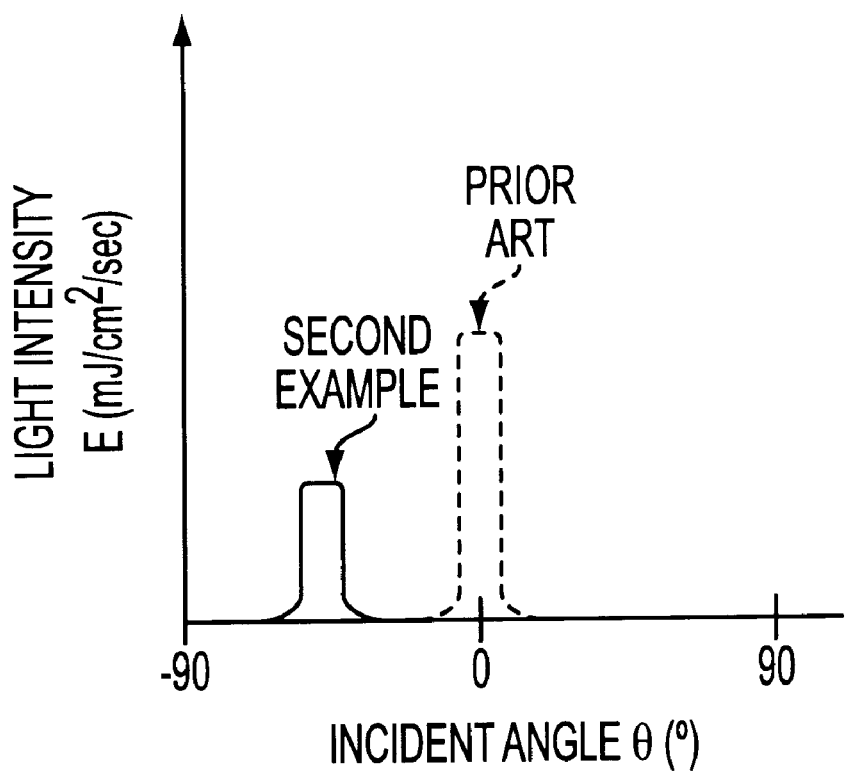

Referring to FIG. 5-(a), the second example is described. In the present example, a wafer 502 is fixed on a stage 501. In the step of exposure, a wide parallel beam of oblique incident light at θ=35° is utilized. The dose of exposure is approximately 120 mJ/cm². Here, a hole for a cylindrical capacitor is ellipse in shape, and is 1.2 μm in depth and 0.4 μm in bore (in the direction of major axis) so that its aspect ratio is approximately 3 As a result of the exposure, the photoresist which remains inside of the hole with a depth of 1.2 μm has a height of 1.05 μm, showing that an excellent selectivity of exposure is obtained therein.

A wide parallel beam of oblique incident light should be large enough to cover, at least, all semiconductor elements on the wafer surface.

As shown in FIG. 5-(b), the light intensity profile of the incident light for the present example has only one peak at the incident angle θ, as the wafer 502 is fixed on the stage 501.

Third Example

Figure 6A:
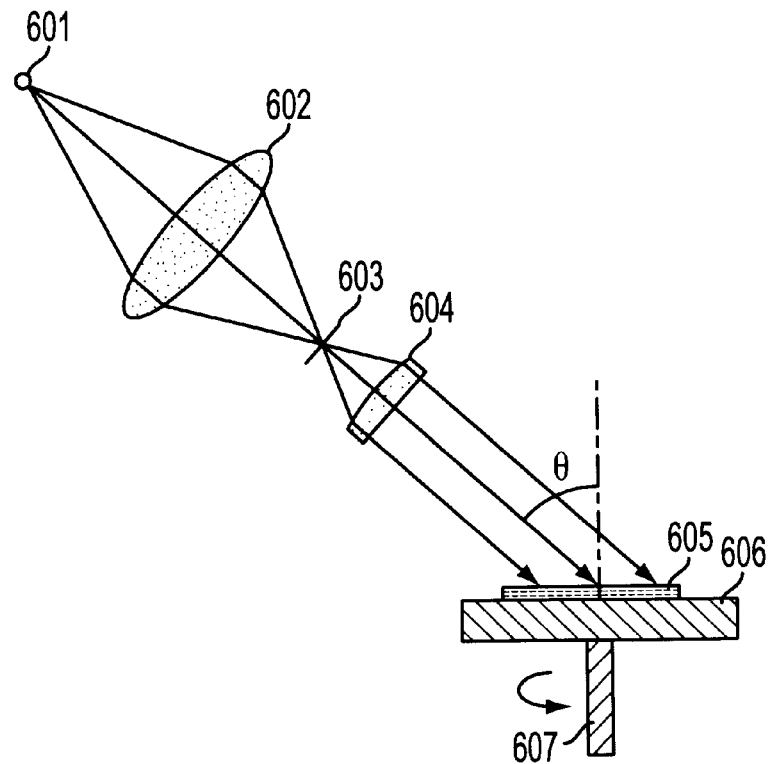
FIG. 6-(a) is a schematic view of the third example.
Figure 6B:
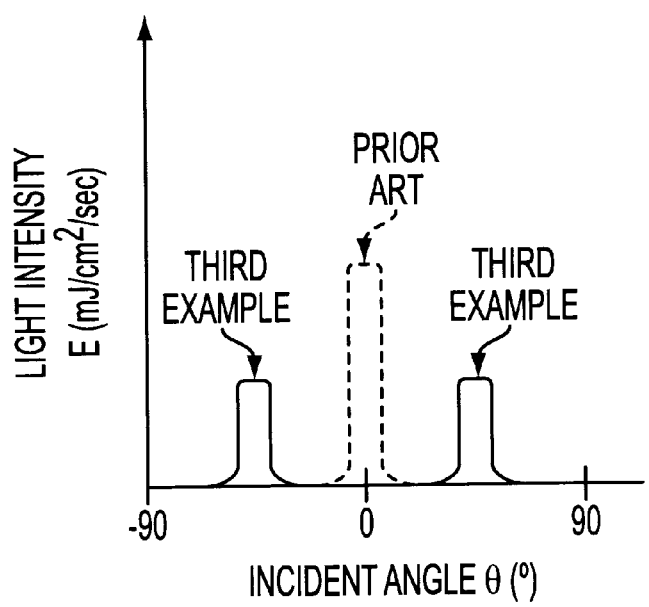

The present example is shown in FIG. 6-(a). In the present example, a wafer 605 is fixed on a stage 606 which rotates around a rotation axis 607. While a wide parallel beam of oblique incident light is utilized as the second example, said beam of oblique incident light is formed through the use of an optical system comprising a condenser lens 602, a shutter 603 and a collimating lens 604.

Here, a hole for a cylindrical capacitor is ellipse in shape, and is 1.2 μm in depth and 0.4 μm in bore (in the direction of major axis) so that its aspect ratio is approximately 3.

Rotating the wafer at 300 rpm and setting the incident angle at 30°, the exposure with a dose of exposure of 110 mJ/cm² is carried out. Because the wafer 605 is rotated, the uniformity of the dose of exposure within the wafer face is improved, compared with that in the second example.

As a result of exposure, the photoresist which remains inside of the hole with a depth of 1.2 μm has a height of 1.08 μm, showing that an excellent selectivity of exposure is obtained therein.

As shown in FIG. 6-(b), the light intensity profile of the incident light for the present example has two peaks, symmetrical around θ=0°.

Fourth Example

Figure 7A:
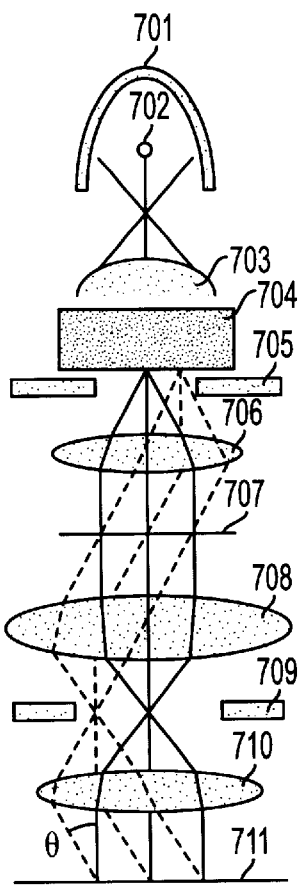
FIG. 7-(a) is a schematic view of the fourth example.
Figure 7B:
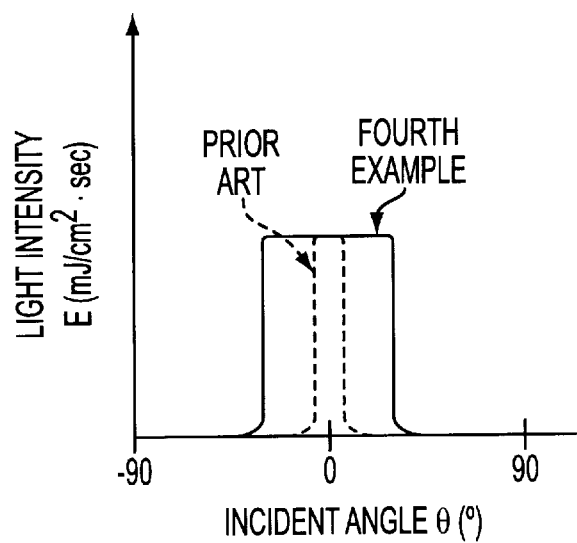

As shown in FIG. 7, the present example is put into operation, through the use of a reduction projection exposure system.

The incident light emitted from the light source 702 is converged by a reflecting mirror 701, and, after passing through a relay lens 703, it is made uniform by an optical integrator 704. After that, the incident light receives adjustment of its resolution at a σ stop 705 and enters a collimating lens to be arranged and emerges as a parallel beam. Subsequently, the light enters a reticle 707 and travels through a reduction optical system comprising a first projection lens 708, a NA stop 709 and a second projection lens 710, and then enters a wafer surface 711.

In said exposure system, the optical system is arranged in such a way that the normal incident light on the reticle 707 enters the wafer in the direct normal (solid line). On the other hand, the oblique incident light to the surface of the reticle 707 also enters the wafer obliquely (dotted line).

Further, while the light entering the wafer in the direction normal passes through the central sections of the aperture stop (σ stop) 705 in the illumination optical system and the stop (NA stop) 709 in the projection optical system, the light entering the wafer obliquely passes through the peripheral sections of the aperture stop (σ stop) 705 in the illumination optical system and the stop (NA stop) 709 in the projection optical system.

Therefore, through regulation of the light passing through the aperture stop (σ stop) 705 in the illumination optical system and the stop (NA stop) 709 in the projection optical system, the angular distribution of the light entering the wafer surface can be controlled.

Figure 9:
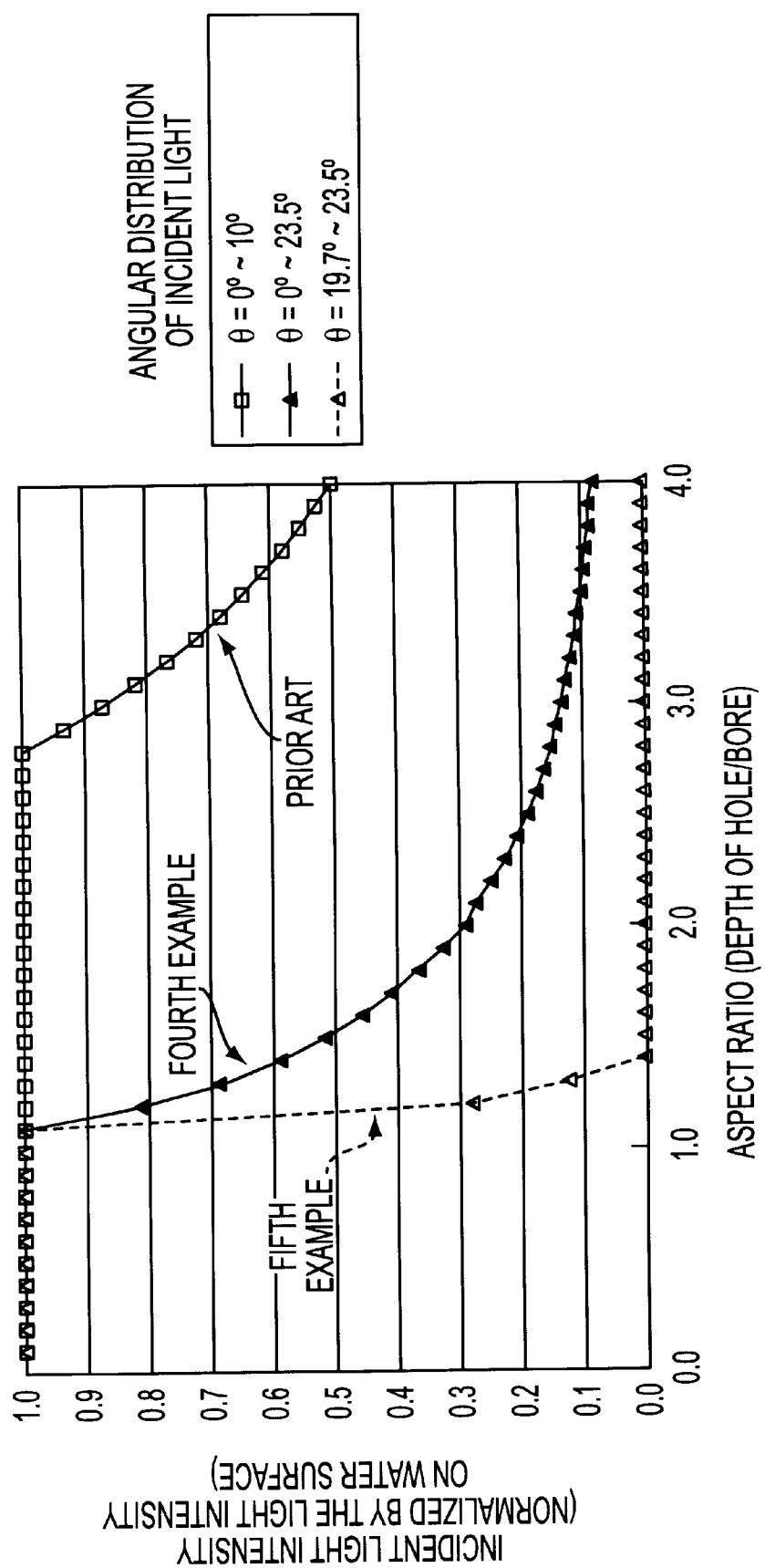
FIG. 9 is a graph showing the aspect ratio dependences of the light intensity in the central section of the cylindrical capacitor.

FIG. 9 is a graph showing the relationship between the aspect ratio of the hole for the cylindrical capacitor and the light intensity of the exposure light in the central section of the hole (calculated value) in the case that the exposure is made using a reduction projection exposure system. The light intensity of the exposure light at the center of the hole bottom, normalized by that on the wafer surface is plotted in vertical axis. The aspect ratio of the hole is plotted in horizontal axis.

In the present calculation, the effect of multiple scattering of the exposure light inside of the resist is not taken into account. Accordingly, the ratio of the light intensities inside of the hole and on the wafer surface, in practice, is considered to be smaller so that the curve in FIG. 9 is thought to shift to the left generally.

The aspect ratio where the intensity of the exposure light starts to decrease depends on the maximum incident angle of the exposure light. The larger the maximum incident angle for the exposure light is, the smaller the aspect ratio (that is, the shallower hole) where the light intensity starts to decrease becomes.

When the maximum incident angles are the same, the decreasing rate of the light intensity of the exposure light (the slope of the curve) depends on the width of the range of the incident angle. With widening the range of the incident angle, the intensity of the incident light on the hole bottom decreases more slowly. This can be seen clearly from the comparison between two curves of the fourth example and the fifth example in FIG. 9. The fifth example in which pupil filters are additionally inserted in the optical system thereof and a certain limitation is placed on the incident angles therein has a higher decreasing rate of the light intensity of the exposure light.

The experiments conducted by the present inventors established that an excellent selectivity of the exposure can be obtained under the conditions that NA is in the range between 0.5 and the maximum value allowed in that optical system and σ is in the range between 0.7 and 1. Here, a hole for a cylindrical capacitor is ellipse in shape, and is 1.2 μm in depth and 0.4 μm in bore (in the direction of major axis) so that its aspect ratio is approximately 3. The dose of exposure for the present example is approximately 120 mJ/cm$^2$. Further, the conditions for the optical system are NA=0.57 and σ=0.7. Under these conditions, the exposure light has an angular distribution of 0–23.5° so that it satisfies the condition that rays whose incident angles with respect to the direction normal to the semiconductor substrate are within 10° do not exceed 50% of the whole incident radiation.

As a result of the exposure, the photoresist which remains inside of the hole with a depth of 1.2 μm has a height of 1.03 μm, showing that an excellent selectivity of the exposure is obtained therein.

For reference, reading from FIG. 9 indicates that the intensity of the incident light on the hole bottom in the present example is approximately 0.13. This demonstrates that, when the light reaches the hole bottom, the intensity lowers to approximately 13% of that on the wafer surface.

The light intensity profile in this case is shown in FIG. 7-(*b*). Differing from the previous examples, the incident light has an equal intensity over a range, symmetrical around θ=0°.

Fifth Example

Figure 8A:
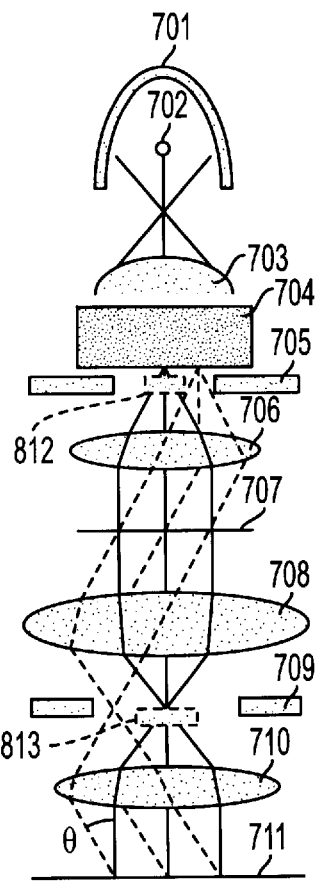
FIG. 8-(a) is a schematic view of the fifth example.
Figure 8B:
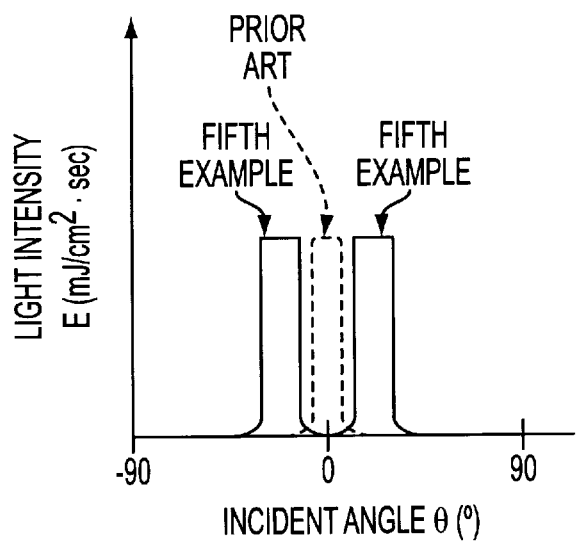

The present example is shown in FIG. 8-(*a*). The present sample differs from the fourth example in a point that angle-limiting filters (a first pupil filter 812 and a second pupil filter 813) are added into an optical system of a reduction projection exposure system.

Here, a hole for a cylindrical capacitor is ellipse in shape, and is 1.2 μm in depth and 0.4 μm in bore (in the direction of major axis) so that its aspect ratio is approximately 3.

The dose of exposure for the present example is approximately 120 mJ/cm$^2$. Further, the conditions for the optical system are NA=0.57 and σ=0.7. Under these conditions, the exposure light has an angular distribution of 19.7–23.5°.

As a result of the exposure, the photoresist which remains inside of the hole with a depth of 1.2 μm has a height of 1.1 μm, showing that an excellent selectivity of exposure is obtained therein.

By two pupil filters additionally inserted in the optical system, components of light close to that of the normal incidence are omitted from the light entering the reticle 707 and, in consequence, the exposure of the photoresist is carried out more selectively.

For reference, reading from FIG. 9 indicates that the intensity of the incident light on the hole bottom in the present example is 0, and the light does not reach the hole bottom directly at all.

Because components close to that of the normal incidence are omitted through the effect of two pupil filters, the angular distribution of the incident light in the present example has two peaks, symmetrical around θ=0°, as shown in FIG. 8-(*b*).

In forming a cylindrical-capacitor lower electrode within a semiconductor memory device, the conventional methods, to date, are incapable to leave enough photoresist inside of a hole for a cylindrical capacitor to protect a conductive film therein, because the exposure is carried out using the normal incident light. In consequence, various problems arise in the later steps. In light of this, the present invention provides a method of manufacturing a cylindrical capacitor, wherein the exposure is made using substantially oblique incident light and thereby sufficient photoresist can be made to remain inside of the hole for the cylindrical capacitor so as to protect a conductive film therein, while an unnecessary part of the photoresist lying outside of the hole can be thoroughly removed.

What is claimed is:

1. A method of manufacturing a cylindrical-capacitor lower electrode for use in semiconductor device; which comprises the steps of:

forming an interlayer insulating film on a semiconductor substrate where semiconductor elements are formed;

opening a recess section that is to function as a mould of a cylindrical-capacitor lower electrode in a prescribed region of said interlayer insulating film;

forming a conductive film over said interlayer insulating film which includes an internal wall of said recess section, without changing the recess form;

coating thick said conductive film with a positive photoresist so as to fill up said recess section;

exposing said photoresist lying on said conductive film to light, while leaving said photoresist inside of said recess section;

developing in which said photoresist lying on said conductive film is selectively removed, while leaving said photoresist inside of said recess section;

performing etch-back in which said conductive film lying on said interlayer insulating film is selectively removed by means of etching, while leaving said conductive film inside of said recess section; and peeling in which said photoresist inside of said recess section is removed; wherein:

in said step of exposure, exposure is made in such a way that the oblique components of the incident light, with respect to the direction normal to the semiconductor substrate is substantially dominant, at least, in the formation region of said lower electrode.

2. The method of manufacturing a cylindrical-capacitor lower electrode according to claim 1, wherein, in said step of exposure, rays whose incident angles with respect to the direction normal to the semiconductor substrate are within 10° do not exceed 50% of the whole incident light on the wafer.

3. The method of manufacturing a cylindrical-capacitor lower electrode according to claim 1, wherein, in said step of exposure, exposure is carried out by the light composed of rays whose incident angles with respect to the direction normal to the semiconductor substrate are not less than 10°.

4. The method of manufacturing a cylindrical-capacitor lower electrode according to one of claim 2, wherein, in said step of exposure, exposure is carried out by a mechanism in which the semiconductor substrate is scanned with the incident light in the direction of a straight line and, synchronized with that, the wafer is moved perpendicular to said scanning direction of the incident light in the plane where the semiconductor substrate is included.

5. The method of manufacturing a cylindrical-capacitor lower electrode according to one of claim 1, wherein, in said step of exposure, exposure is collectively applied to all semiconductor elements on the semiconductor substrate by a parallel beam.

6. The method of manufacturing a cylindrical-capacitor lower electrode according to claim 5, wherein, in said step of exposure, exposure is carried out with the semiconductor substrate being rotated.

7. The method of manufacturing a cylindrical-capacitor lower electrode according to one of claim 2, wherein, in said step of exposure, exposure is conducted by a reduction projection exposure system.

8. The method of manufacturing a cylindrical-capacitor lower electrode according to claim 7, wherein, in said step of exposure, conditions for an optical system in said reduction projection exposure system are $NA \geq 0.5$ and $0.7 \leq \sigma \leq 1$.

9. The method of manufacturing a cylindrical-capacitor lower electrode according to claim 8, wherein an optical system in said reduction projection exposure system has a filter that limits the incident angles of the incident light.

10. A method of manufacturing a semiconductor device which includes the manufacturing method according to one of claim 1 as a step thereof.

* * * * *